United States Patent
Abadeer et al.

(10) Patent No.: US 8,232,177 B2
(45) Date of Patent: Jul. 31, 2012

(54) METHOD OF GENERATING UNIFORMLY ALIGNED WELL AND ISOLATION REGIONS IN A SUBSTRATE AND RESULTING STRUCTURE

(75) Inventors: Wagdi Abadeer, Jericho, VT (US); Lilian Kamal, legal representative, Saratoga, CA (US); Kiran V Chatty, Williston, VT (US); Robert J Gauthier, Jr., Hinesburg, VT (US); Jed H Rankin, Richmond, VT (US); Robert R Robison, Colchester, VT (US); William Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 12/570,415

(22) Filed: Sep. 30, 2009

(65) Prior Publication Data

US 2011/0073985 A1    Mar. 31, 2011

(51) Int. Cl.
    *H01L 21/76*    (2006.01)
(52) U.S. Cl. ................. 438/424; 257/E21.546
(58) Field of Classification Search .................. 438/424; 257/E21.546
    See application file for complete search history.

(56) References Cited

U.S. PATENT DOCUMENTS

| 6,323,103 | B1 * | 11/2001 | Rengarajan et al. | 438/424 |
|---|---|---|---|---|
| 6,693,315 | B2 * | 2/2004 | Kuroda et al. | 257/288 |
| 2006/0040464 | A1 * | 2/2006 | Jung | 438/424 |
| 2007/0293016 | A1 * | 12/2007 | Luo et al. | 438/424 |
| 2009/0261446 | A1 * | 10/2009 | Gogoi | 257/500 |

OTHER PUBLICATIONS

W. Abadeer, et al. "A Capacitance Reliability Degradation Mechanism in Hyper Abrupt Junction Varactors", 2008 IEEE, 46th Annual International Reliability Physics Symposium, Phoenix, 2008 pp. 310-314.

* cited by examiner

*Primary Examiner* — Trung Q Dang
(74) *Attorney, Agent, or Firm* — David Cain; Roberts Mlotkowski Safran & Cole, P.C.

(57) ABSTRACT

A solution for alleviating variable parasitic bipolar leakages in scaled semiconductor technologies is described herein. Placement variation is eliminated for edges of implants under shallow trench isolation (STI) areas by creating a barrier to shield areas from implantation more precisely than with only a standard photolithographic mask. An annealing process expands the implanted regions such their boundaries align within a predetermined distance from the edge of a trench. The distances are proportionate for each trench and each adjacent isolation region.

3 Claims, 15 Drawing Sheets

METHOD OF GENERATING UNIFORMLY ALIGNED WELL AND ISOLATION REGIONS IN A SUBSTRATE AND RESULTING STRUCTURE

BACKGROUND OF THE INVENTION

1. Field of the Invention

This invention generally relates to a semiconductor structure, and more specifically to a semiconductor structure having no edge placement variation of well implants relative to the isolation structure.

2. Background of the Invention

CMOS technologies continue scale smaller and smaller. As a result parasitic bipolar leakages become harder to control. In traditional process flows, well implants are defined using purely lithographics definition done independently from lithographic steps used for defining physical isolation structures. This independence creates inherent variability.

BRIEF SUMMARY OF THE INVENTION

The following describes a structure and method for alleviating parasitic bipolar leakages in scaled semiconductor technologies. The structure has no edge (or boundary) placement variation for edges of implants under shallow trench isolation (STI) areas, in other words, the distance between the edges of the STI and the corresponding edges or boundaries of implanted wells beneath a given STI are substantially equal.

DETAILED DESCRIPTION

Figure 1:
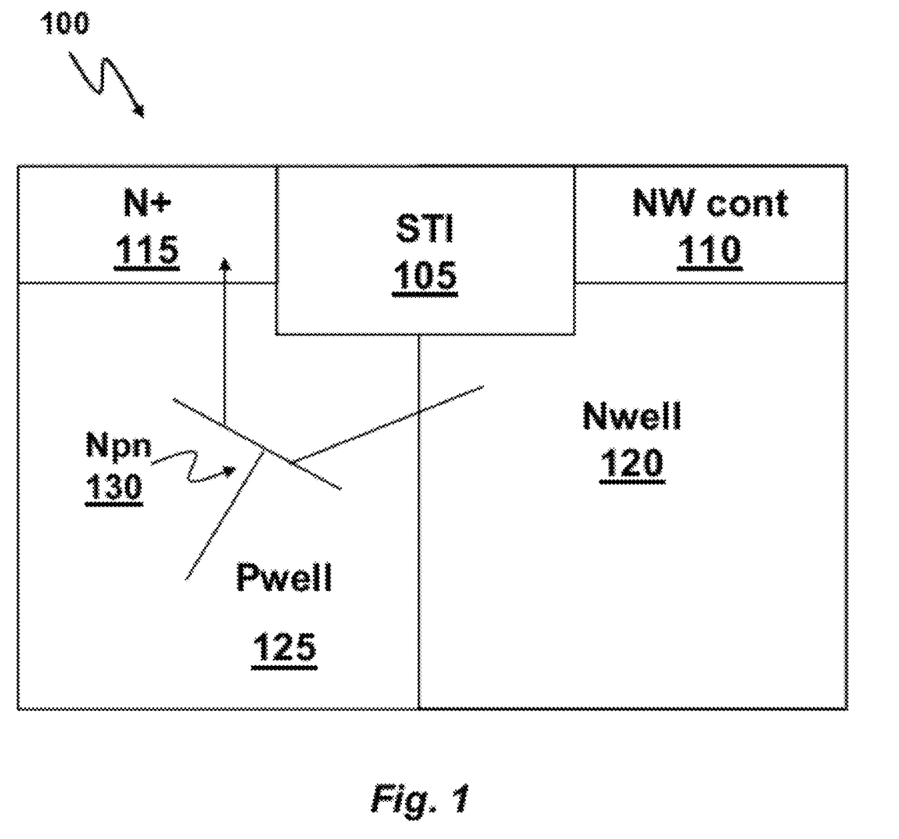
FIG. 1 is a diagram showing the problem to be solved.

FIG. 1 illustrates a problematic parasitic effect shown as NPN device 130 in structure 100. NPN device 130 represents a function that occurs when the boundaries between two (or more) implanted (or doped) regions (e.g. Pwell 125, Nwell 120, and N+ region 115) are touching or very nearly touching. The parasitic effect varies depending on the distance between the adjacent doped regions. In this example, a parasitic effect is created beneath a shallow trench isolation (STI) region 105 at the Nwell 120 and Pwell 125 junction.

Figure 2:
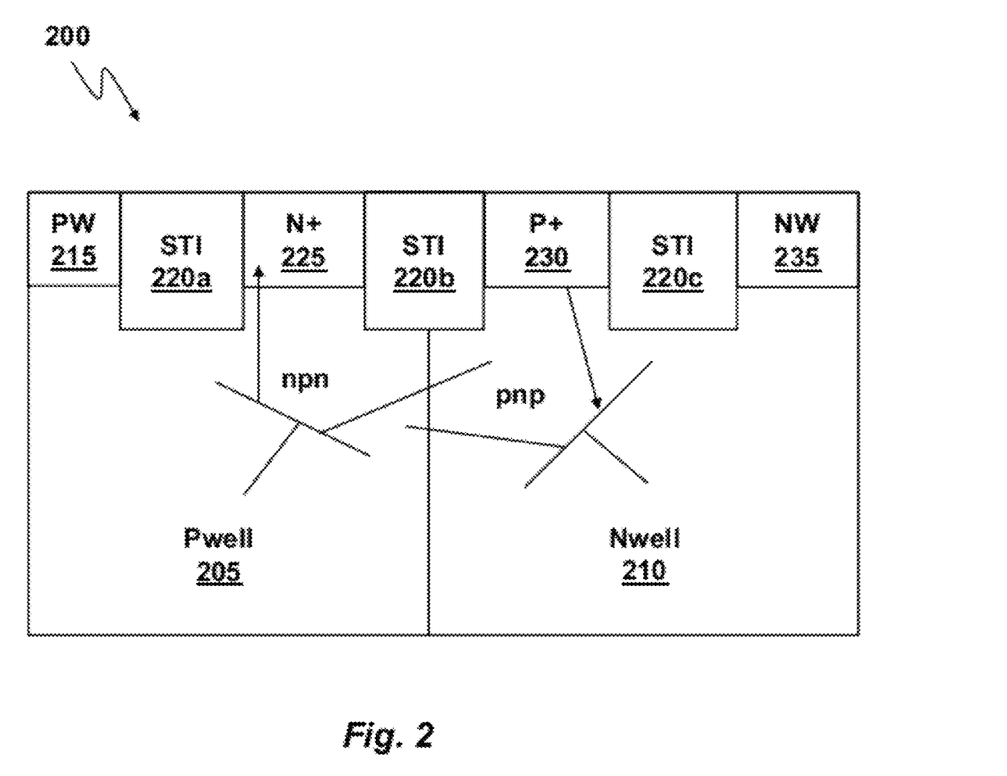
FIG. 2 is demonstrates the various types of parasitic devices which are inadvertently formed.

FIG. 2 represents the growing complexity of the problem as more devices are manufactured within smaller areas on a wafer (e.g. scaling semiconductor technologies to become smaller and smaller). Structure 200 shows two parasitic devices (npn and pnp) created between an N+ region 225, Pwell 205 and Nwell 210; and P+ region 230, Nwell 210 and Pwell 205 respectively.

Figure 3:
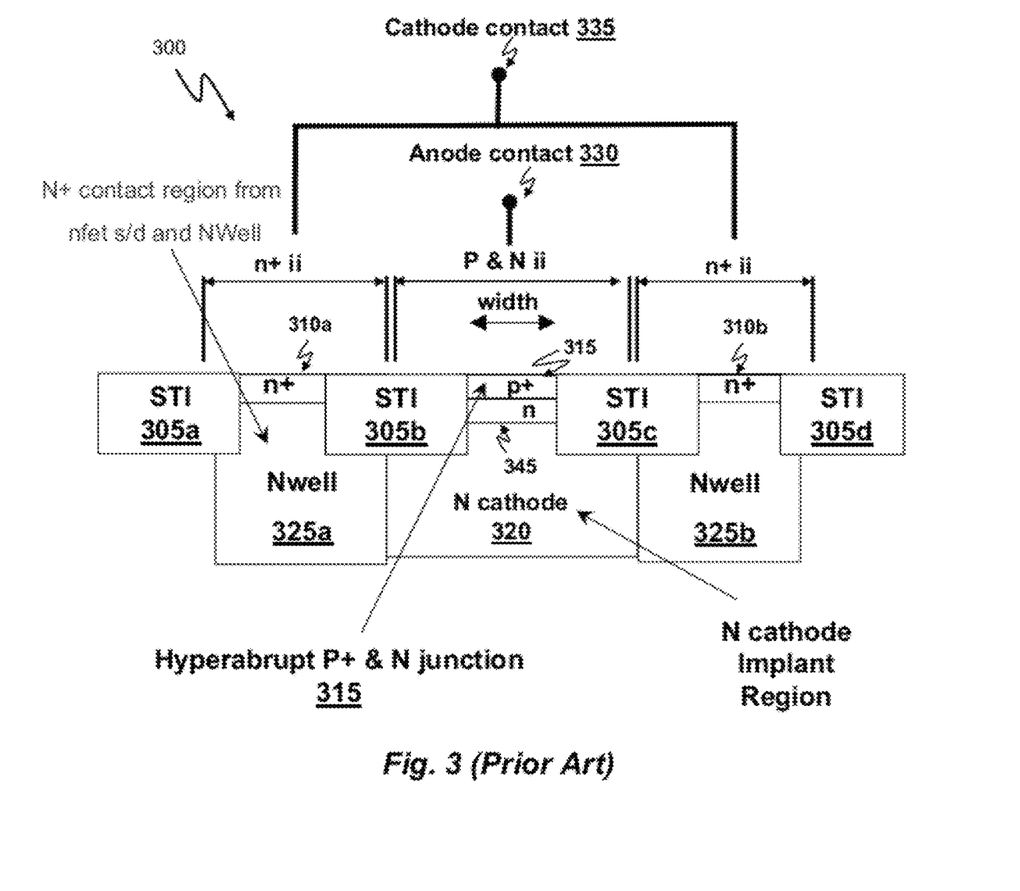
FIG. 3 is an illustration of the problem and shows advantages offered by the solution.

FIG. 3 shows a prior art solution to the parasitics problem as structure 300. Structure 300 is a hyper-abrupt junction varactor having p+-n junctions 315, cathode contact 335, anode contact 330, an N cathode implant region 320, Nwells 325a and 325b, n+ regions 310a and 310b, and STIs 305a-d. This figure demonstrates the size of the structure required to avoid generation of the variable parasitic devices.

In conventional processing, STI is defined prior to well implants. In some cases, the implants penetrate the side walls of one or more of STIs 305. FIG. 3A shows 'n+ii', 'P&Nii', and 'n+ii' ion implants, which extend into the STI walls 305 for each device. The small geometries result in narrow anode widths as shown in FIG. 3A. Degradation of an ideality factor is significant for small geometry diodes such as P-n diodes bounded by STIs having implant penetration. An ideality factor is a constant adjustment factor used to correct for discrepancies between an ideal PN junction equation and a measured device.

Figure 4A:
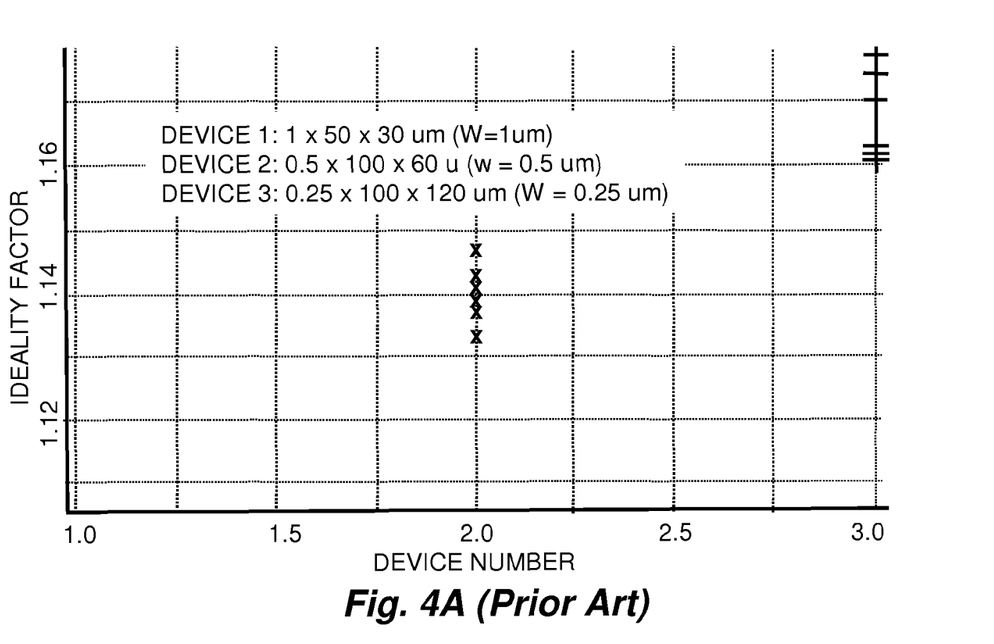
FIGS. 4A and 4B are each a view of simulation of electrical properties using the prior art solution.

FIG. 4A shows a simulated degradation of the ideality factor as a function of width. Simulated device 1 shown in FIG. 3 has a width of 1 um resulting in an ideality factor of 1.16 or greater. Device 2 has a width of 0.5 um and a corresponding ideality factor of between 1.13 and 1.15. Likewise, device 3 has a width of 0.25 um and an ideality factor of less than 1.13. The decreasing widths directly correlate with decreasing ideality factors.

Figure 4B:
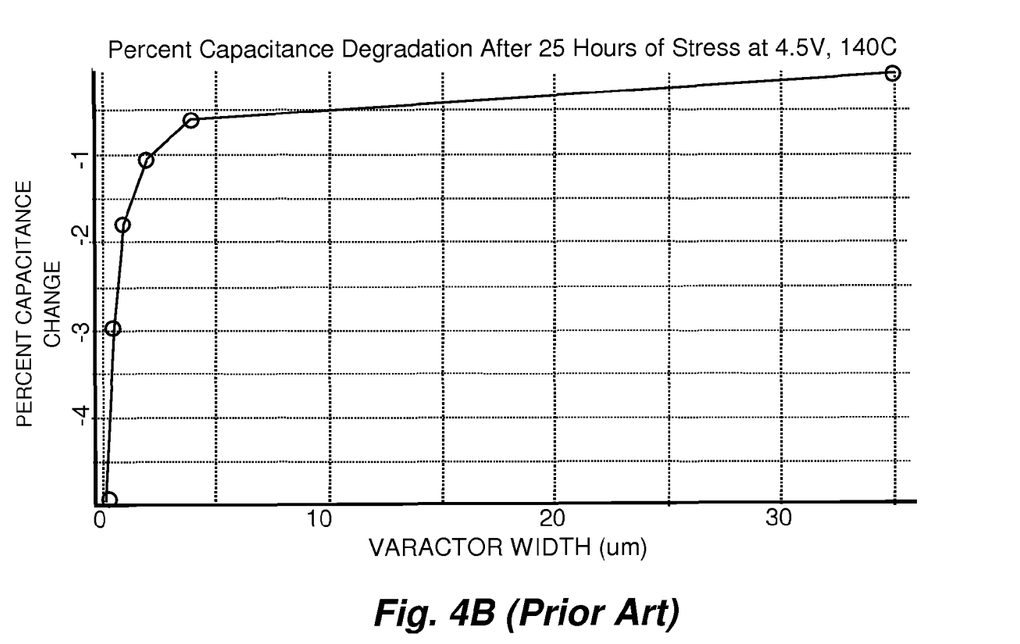

FIG. 4B shows a simulation plot for a percent capacitance degradation after 25 hours of stress (reverse bias mode) at 4.5V and 140° C. As the varactor width (in um) increases the percent capacitance change approaches 0% after 25 hours of stress. The reliability degradation of the varactor capacitance is directly proportional to the degradation of the ideality factor.

Figure 5A:
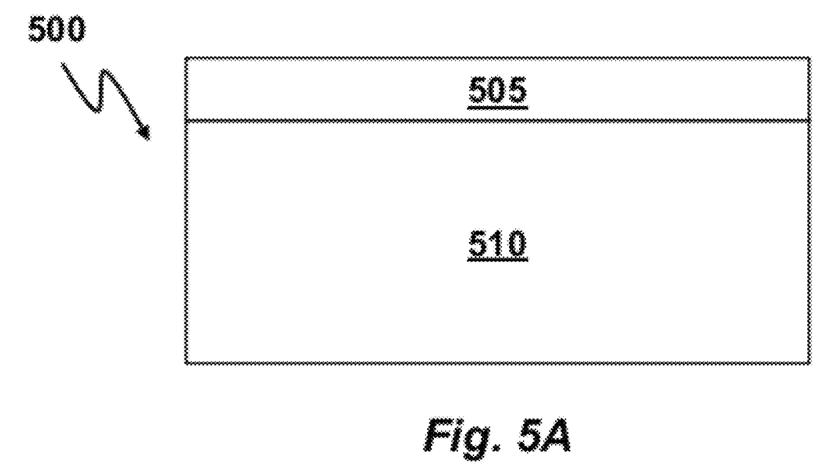
FIG. 5A is a view of an embodiment at a step in a process where a second layer is deposited onto a first substrate.
Figure 5B:
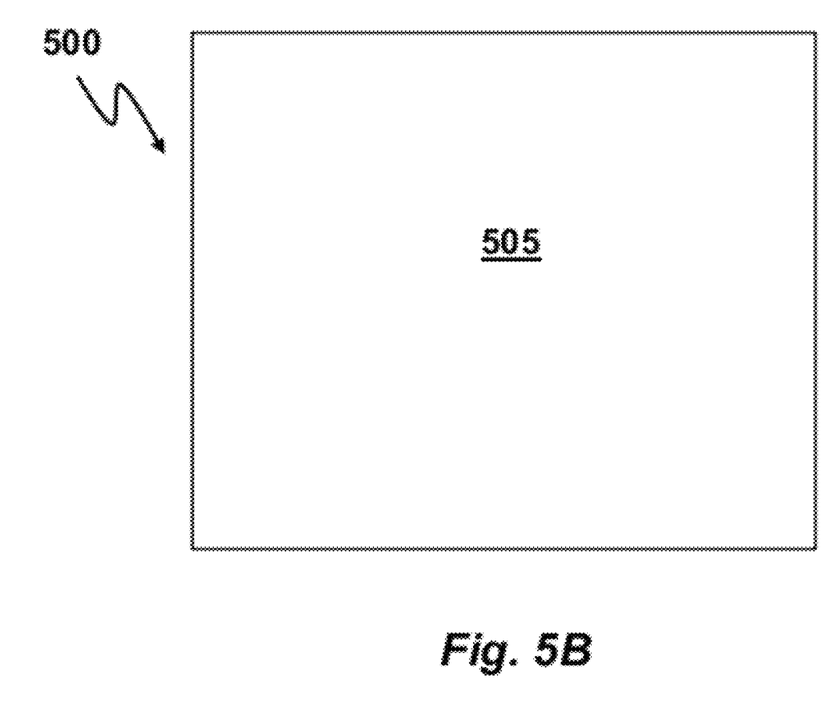
FIG. 5B is a top view of an embodiment of the invention at that step in the process, showing second layer after deposition.

FIG. 5A shows a side view of a structure 500 having a substrate 510 (for example a layer of silicon such as one used for a wafer), and a film 505 is deposited over substrate 510 (for example a layer of oxide); FIG. 5B shows a top view of structure 500, which shows film 505 deposited over substrate 510.

Figure 6A:
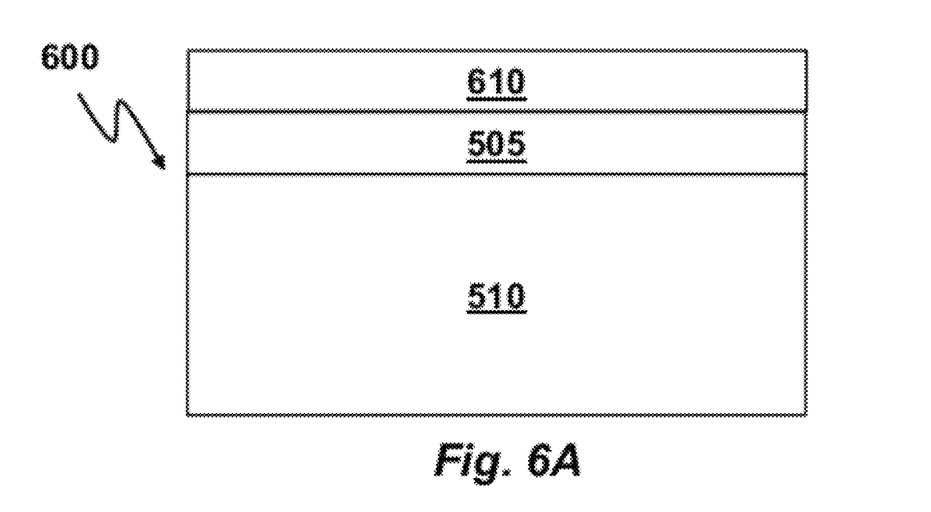
FIG. 6A is a view of an embodiment at another step in the process where a third layer is deposited over the second layer on the substrate.
Figure 6B:
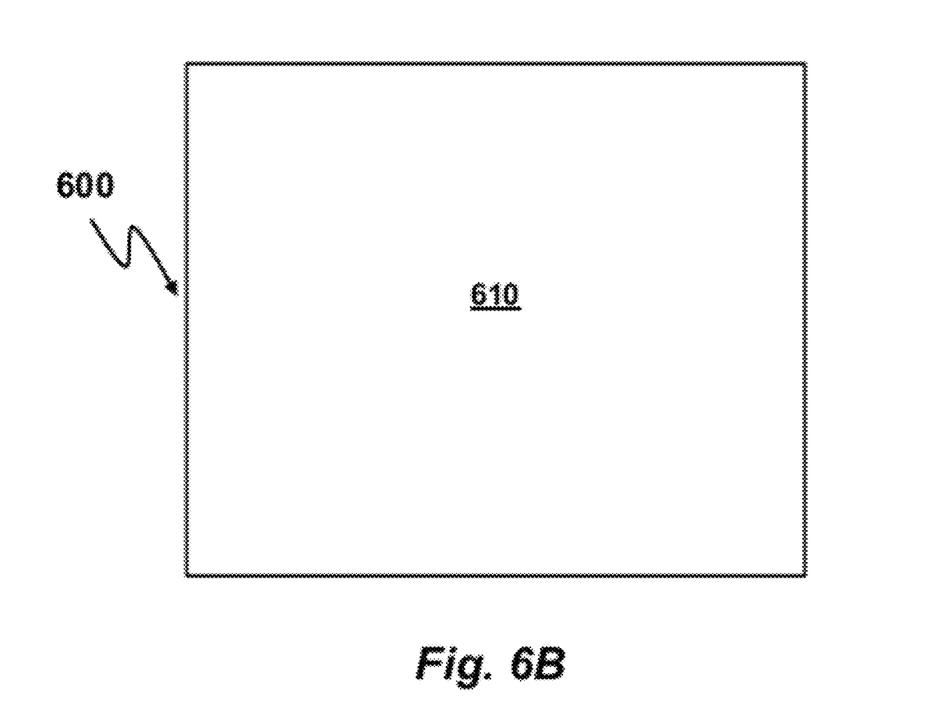
FIG. 6B is a top view of this embodiment of the invention and shows the third layer overlaying the second layer on the substrate.

FIG. 6A shows a side view of a structure 600 having a third film 610 (for example a Polysilicon layer) deposited over substrate 510; FIG. 6B shows the top view of structure 600 having the top layer of film 610.

Figure 7A:
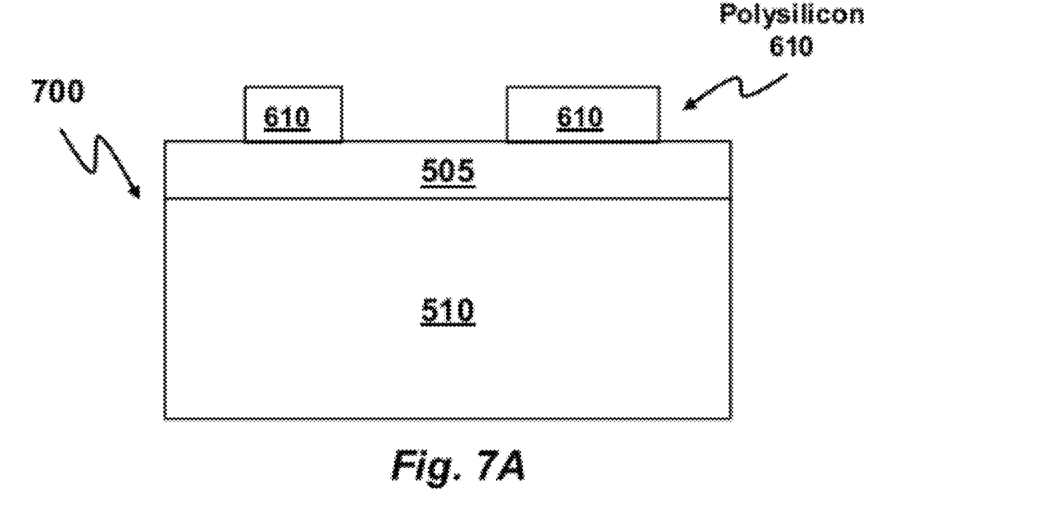
FIG. 7A illustrates a side view of a structure which has had portions of the top substrate removed using a chemical etch process or other process which provides similar results.
Figure 7B:
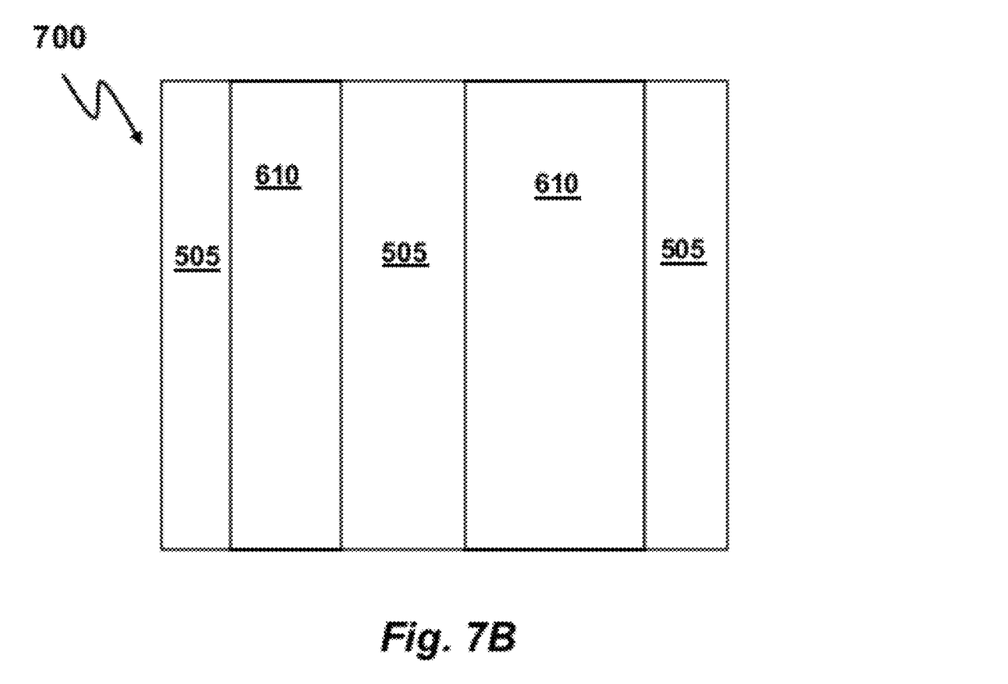
FIG. 7B illustrates the result from the top view.

FIG. 7A shows a structure 700 after patterning. The process may include, for example a photolithography step and a subsequent etching step. The process generates structure 700 which shows a patterned film 610; FIG. 7B illustrates an example of a top view of structure 700 having the patterned film 610 and the exposed film 505 beneath.

Figure 8A:
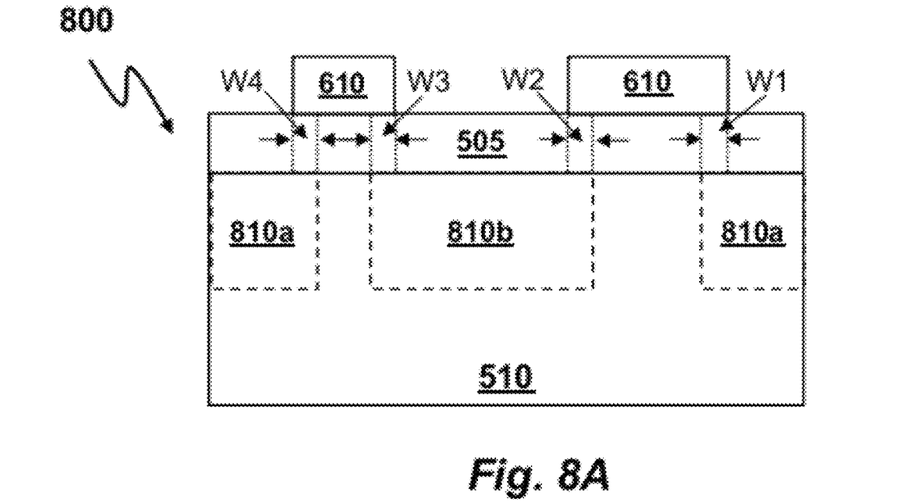
FIG. 8A illustrates a side view of a structure having implants (e.g. n-well, p-well) and an annealing process. The edges or boundaries of the implants are located at a predetermined distances from the planned STI placement.
Figure 8B:
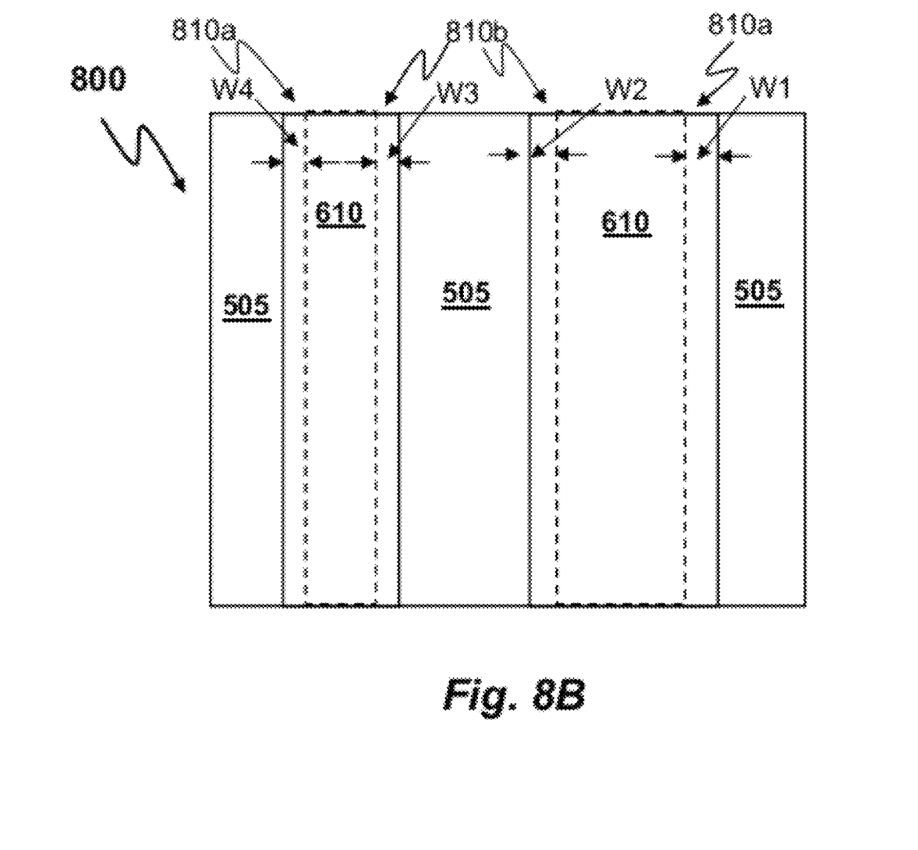
FIG. 8B shows a top view of the structure.

FIG. 8A shows a side view of a structure 800 having been through processing that includes, for example, a well implant step (e.g. ion implant or doping step) and an annealing step. Wells 810a and 810b are formed in substrate 510 through, for example, the use of a photomask (not shown) followed by ion implantation, thermal activation, and annealing, and may be, for example, n-wells (810a) or p-wells (810b). Substrate 510, directly beneath film 610 (and corresponding photomasks) is shielded from the implants. The implanting step is followed by an annealing process. In this example implant areas 810 expand during the annealing process such that their edges (or boundaries) are located a predetermined distance from the edges of film 610; FIG. 8B shows a top view of structure 800, which shows films 610 and 505. Implants 810 are beneath film 505 and their boundaries are shown as dotted lines 810a and 810b. The boundaries reside at predetermined distances from the edges of film 610 shown by way of illustration as W1, W2, W3, and W4.

Figure 9A:
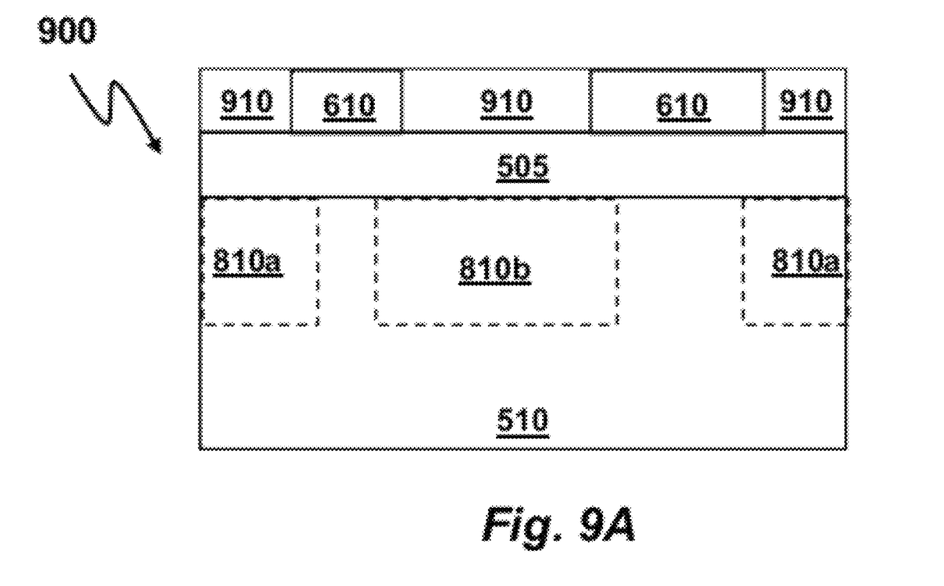
FIG. 9A illustrates a step of depositing a fourth substrate (e.g. nitride) over the second substrate and adjacent to the third substrate and performing a polishing process.
Figure 9B:
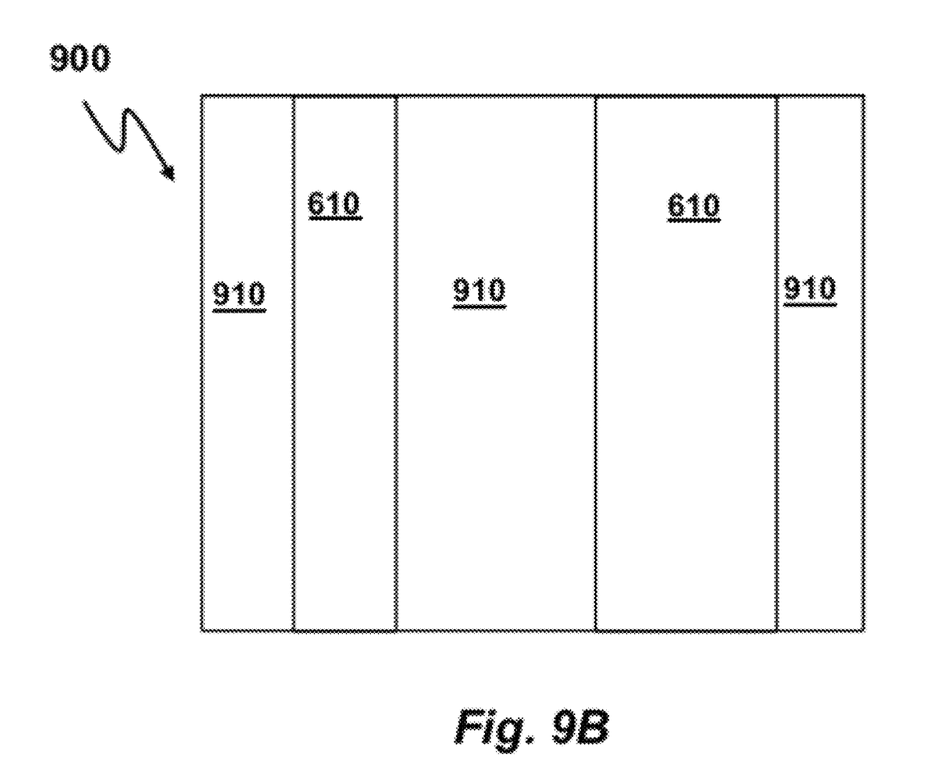
FIG. 9B illustrates an example top view of the results of the depositing step.

FIG. 9A shows structure 900 after several processing steps, for example, a nitride deposition step, and a planarization step such as by chemical mechanical planarization (CMP). Structures 910 (e.g. a nitride) is deposited over film 505 then a step such as a planarization step for example, is used to polish structures 910 to be nearly even with the top of film 610; FIG. 9B shows a top view of structure 900 having structures 910 and film 610 visible.

Figure 10A:
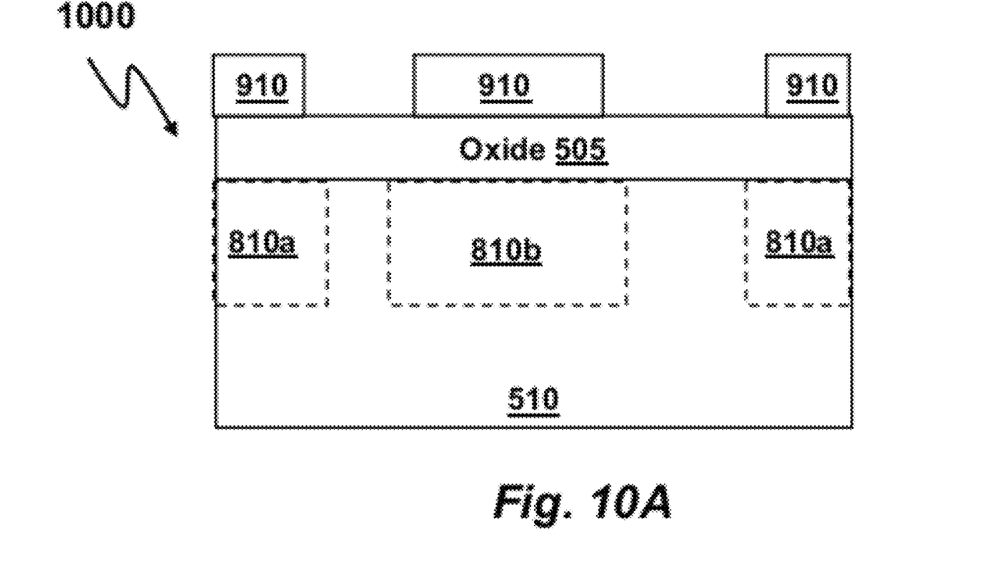
FIG. 10A illustrates a side view of the structure after removing the third substrate (e.g. Polysilicon).
Figure 10B:
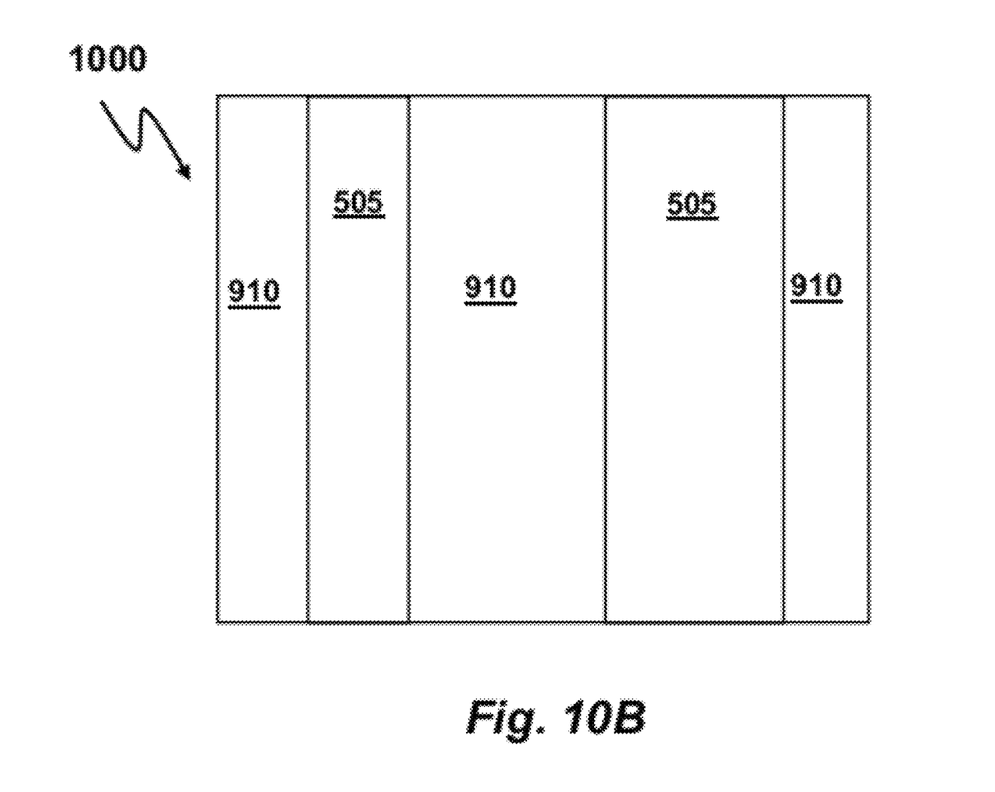
FIG. 10B illustrates a top view of the structure.

FIG. 10A shows structure 1000 after film 610 has been removed. The patterned film 610 may be removed using a stripping process, for example; FIG. 10B shows a top view of structure 1000 having structures 910 and film 505.

Figure 11A:
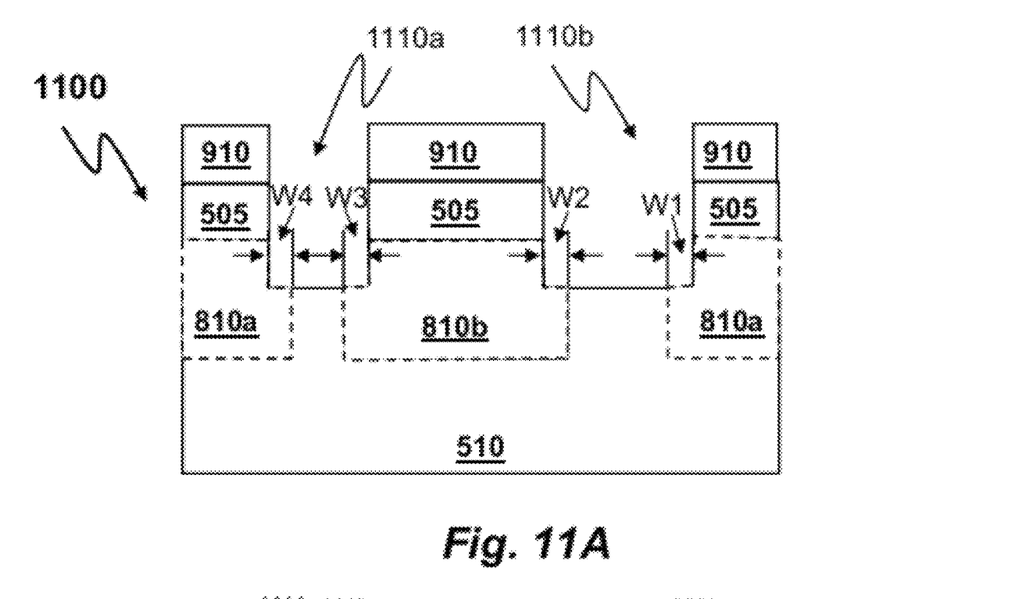
FIG. 11A shows the structure after an etch process to remove a portion of the first and second substrates (e.g. silicon and oxide)
Figure 11B:
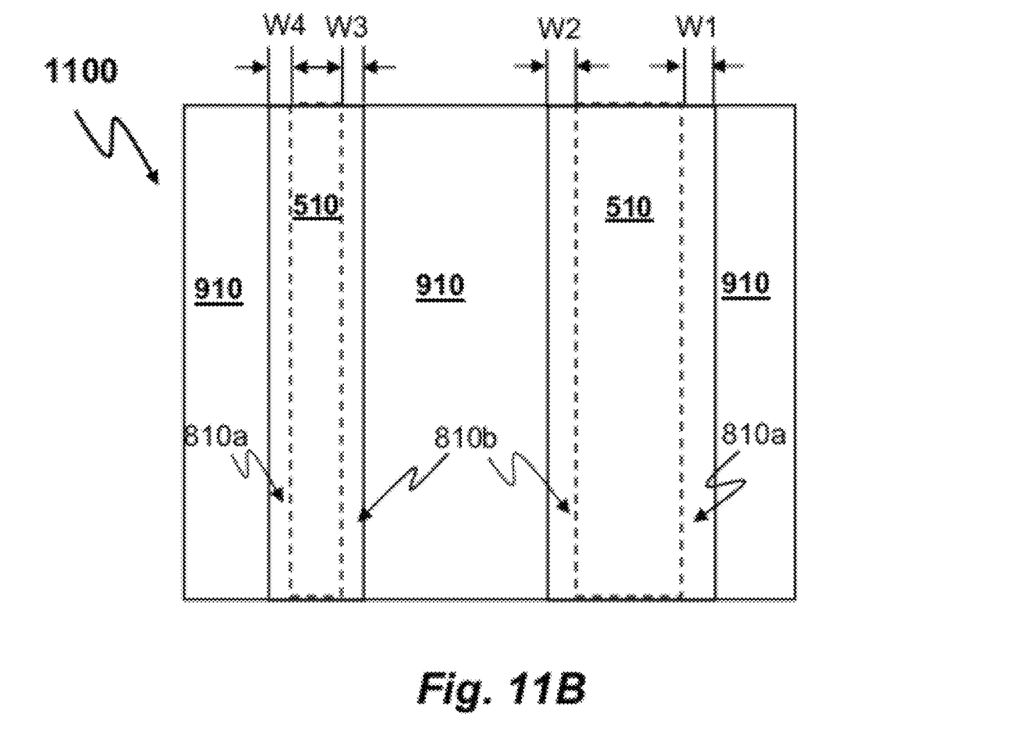
FIG. 11B shows a top view of the structure.

FIG. 11A shows a side view of structure 1100 where film 505 and substrate 510 have undergone a stripping and/or etching process (for example a reactive ion etching (RIE) process known to those of ordinary skill in the semiconductor manufacturing field) to generate trenches 1110a and 1110b (or depressions, channels, etc.). Optionally, additional processing may be implemented at this stage, for example additional ion implant processes; FIG. 11B shows a top view of structure 1100 with exposed substrate 510, implant areas 810, and structures 910.

Figure 12A:
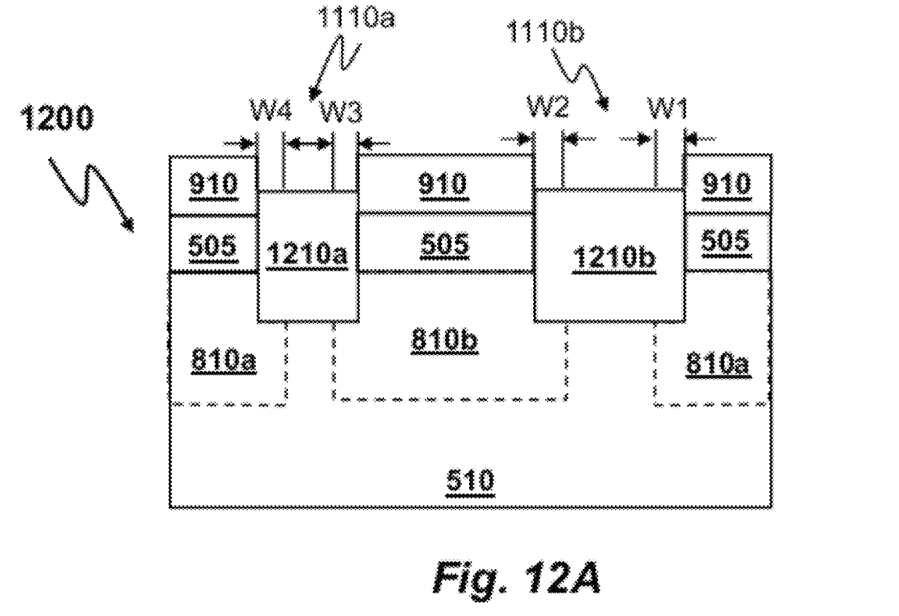
FIG. 12A shows the structure having a fifth film deposited in the shallow trench isolation (STI) areas.
Figure 12B:
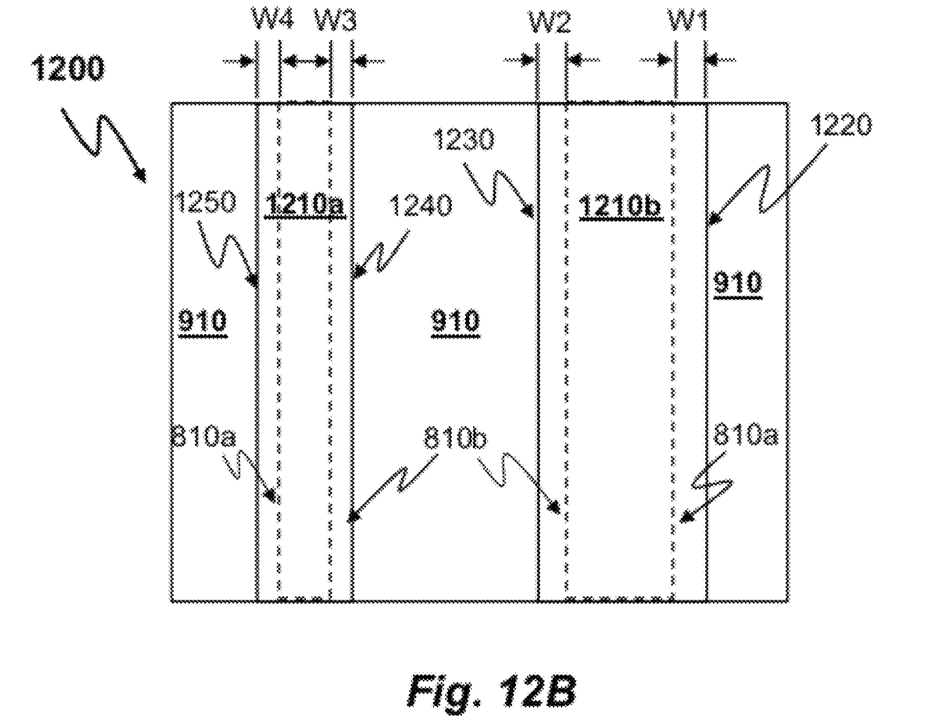
FIG. 12B shows a top view of the structure at this step in the process.

FIG. 12A shows a side view of a structure 1200 having a material 1210a and 1210b, such as an isolation material (e.g. oxide) for example, deposited over structure 1200 to fill-in trenches 1110a and 1110b respectively, thereby creating a shallow trench isolation area. A subsequent polishing step (e.g. a CMP) step is used after deposition. FIG. 12B shows a top view of structure 1200 having structures 910 and the isolation materials 1210 in trenches 1110 visible from the top.

One edge of trench 1110b is shown as edge or boundary 1220, a second boundary of trench 1110b is shown as boundary 1230. A first and second boundary of trench 1110a is shown as boundaries 1240 and 1250 respectively.

Figure 13A:
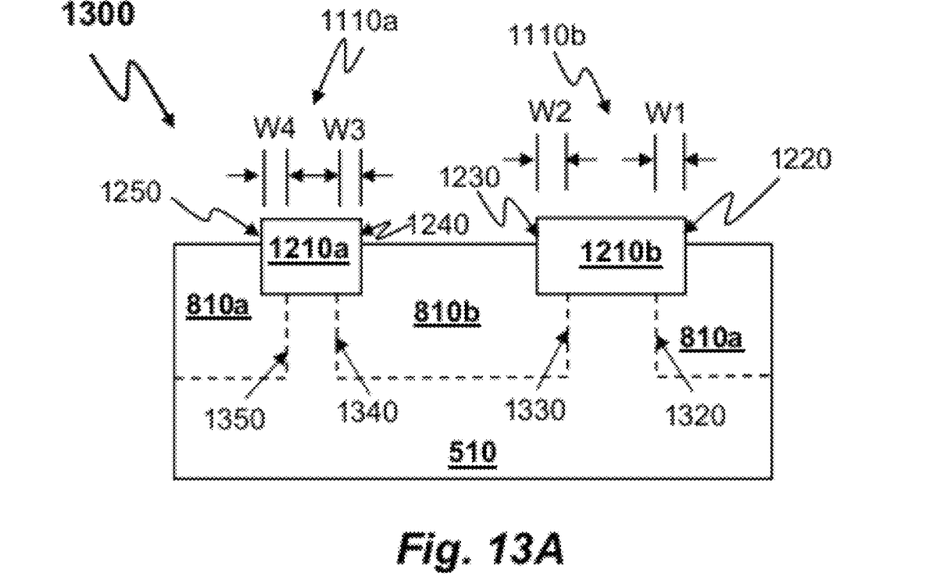
FIG. 13A illustrates an example of the structure having a similar distance between a first implant (or doped) region and an STI and a second implant (or doped) region on the other side of the STI.
Figure 13B:
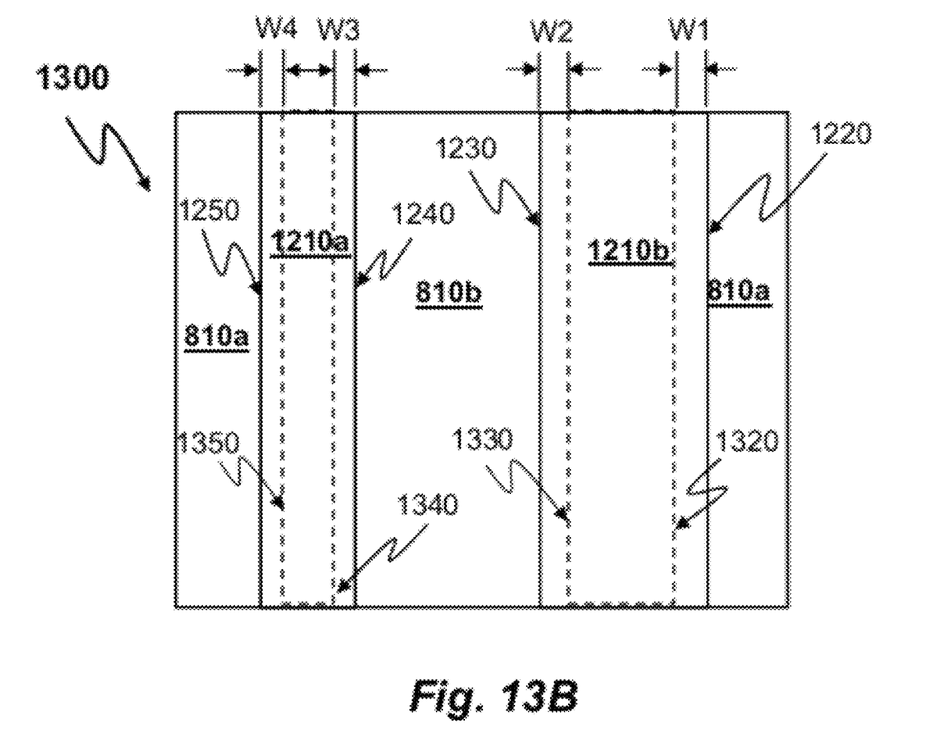
FIG. 13B shows a top view of the structure shown in FIG. 13A.

FIG. 13B shows a top view of structure 1300 which includes a substrate 510 having the material 1210a and b (e.g. oxide to create an STI) and at least a first region (e.g. a doped or ion implanted region 810a); the trench 1110a having the first edge or first boundary 1220 (e.g. the side wall or bottom of the trench 1110b or material 1210b); the first region 810a having a boundary 1320 (e.g. the edge or boundary of the doped region 810a where it connects to an adjacent substance such as oxide material of 1210b); the first region (e.g. the doped region 810a) being coupled to (e.g. touching) at least a first portion of the trench 1110b (e.g. the bottom and/or side of the trench 1110b or material 1210b) such that a portion of the boundary 1320 of the first region 810a is at a predetermined distance W1 from the first edge 1220 of trench 1110b (e.g. with respect to the side of the trench and doped regions as shown as W1 between elements 810a and 1210).

FIGS. 13A and 13B also show the structure 1300, having a second region 810b (e.g. another doped region); the second region 810b having a second boundary 1330 (e.g. edge) coupled to at least a second portion of the material 1210b (e.g. a sidewall and/or bottom of trench 1110b) such that a second portion of the second boundary 1330 (e.g. a portion of the boundary around second region 801b) is at a second predetermined distance (W2) from a second edge boundary 1230 of trench 1110b. The predetermined distance, W1, and the second predetermined distance W2, are substantially similar (e.g. W1 is about equal to W2).

Likewise, FIGS. 13A and 13B show: the second trench 1110a having a material 1210a, a boundary 1240 of trench 1110a, and a doped region 810b having a boundary 1340 and adjacent to material 1210a. The distance between boundaries 1240 and 1340 is shown as W3. Region 810a further has a second boundary 1350 adjacent to a second boundary 1350 of material 1210a. The distance between boundary 1250 and boundary 1350 is shown as W4. Where W3 and W4 are substantially equal.

The predetermined distance from the first edge (W1) and the second predetermined distance (W2), may be within, for example, about 10 nm, 10 nm should not be construed as a limitation however. Likewise, the predetermined distance (W3) is equivalent to within 10 nm of the distance (W4).

Figure 14:
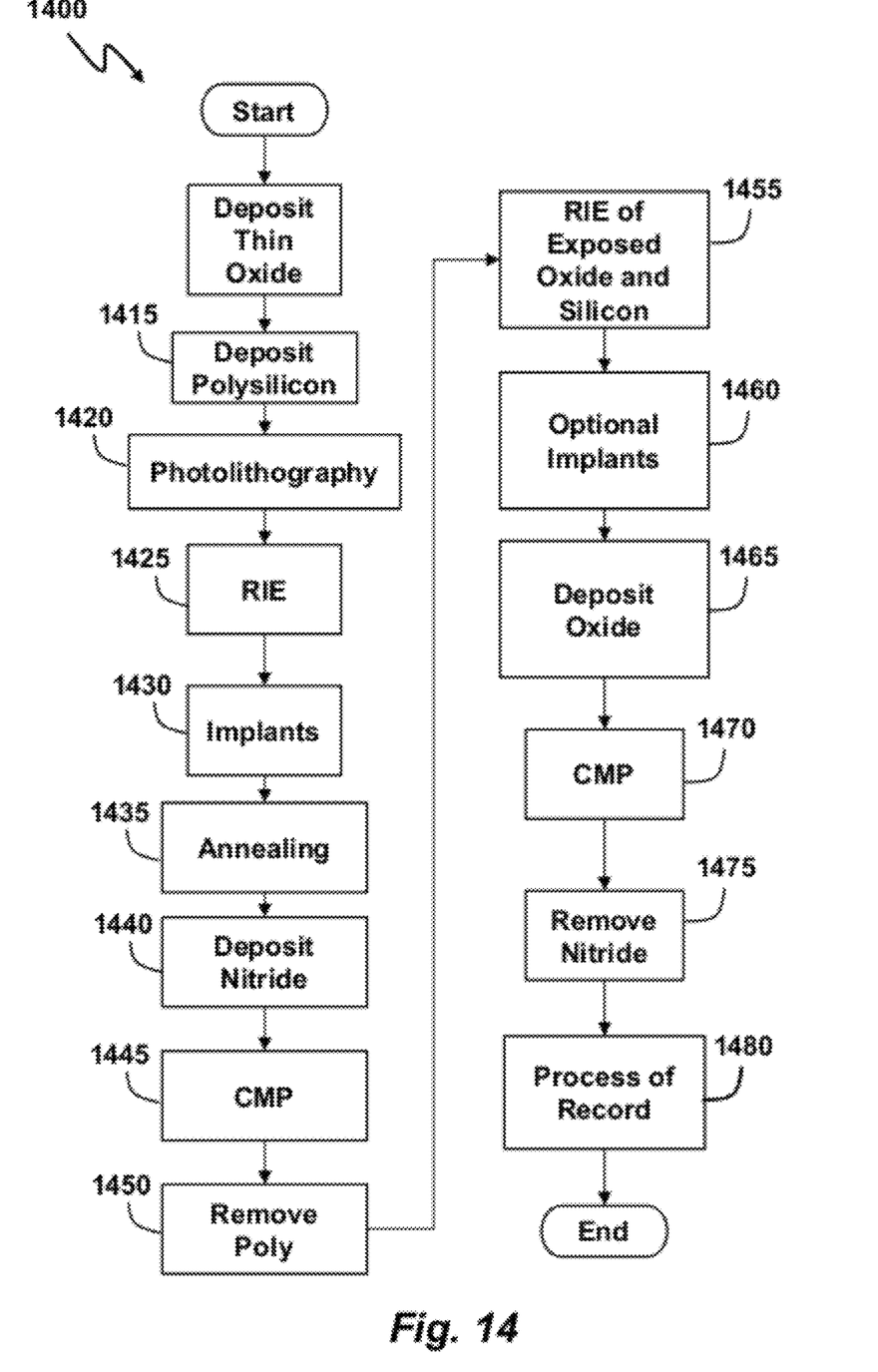
FIG. 14 illustrates a flow diagram of an example process used to make the structure.

FIG. 14 shows a flow diagram of a method 1400 of making structure 1300. Step 1410: deposit a material film 505 such as a thin oxide for example, over a substrate 510 such as a silicon wafer.

Step 1415: deposit a second film 610, such as Polysilicon, adjacent to film 505;

Step 1420: perform photolithography using a reticle and photoresist, which will shield substrate 510 from unwanted implantation and guide self-alignment of the wells 810 to the STIs 1210;

Step 1425: perform an etch process to remove film 610 where any implants 810 are desired;

Step 1430: implant in the exposed film 505 to generate implant areas or wells 810;

Step 1435: anneal the subsequent structure to evenly expand areas 810 under film 610;

Step 1440: deposit a structure 910 (e.g. nitride) over film 505;

Step 1445: perform a CMP process to even the thickness of structure 910 with film 610;

Step 1450: remove film 610 (e.g. Polysilicon) using a stripping process;

Step 1455: perform an RIE step on the exposed substrate 510 and film 505 (e.g. oxide and silicon);

Step 1460: optionally, perform additional implants into exposed substrate 510;

Step 1465: deposit a film such as an oxide to generate isolation regions (STIs) 1210;

Step 1470: perform a CMP process to remove overfill of trenches;

Step 1475: remove structures 910 (e.g. nitride); and

Step 1480: perform the process of record (POR). For example, forming FETs and wires to create a functional IC.

Figure 15A:
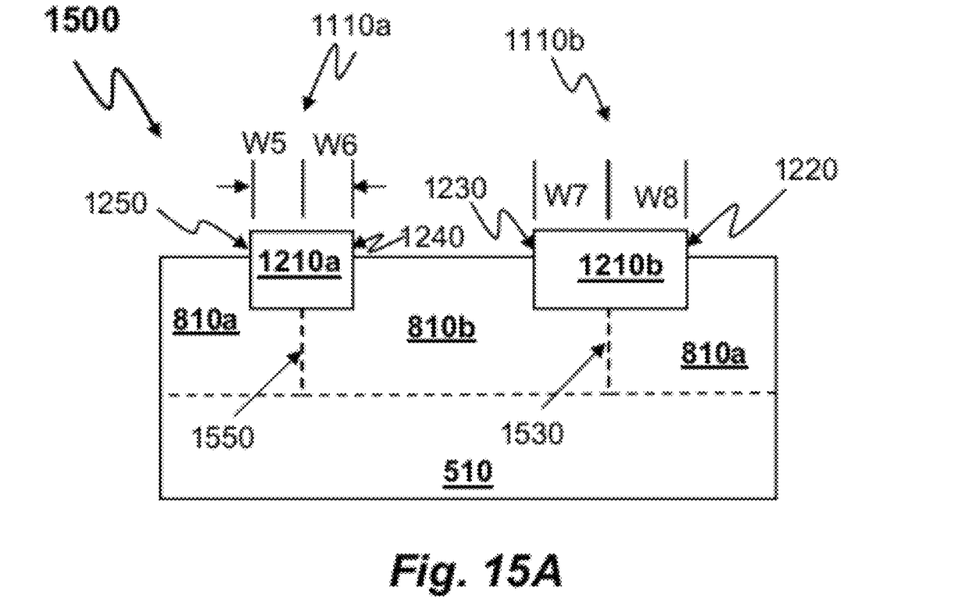
FIG. 15A illustrates an example of the structure having a similar distance and coupled between a first implant (or doped) region and an STI and a second implant (or doped) region on the other side of the STI.
Figure 15B:
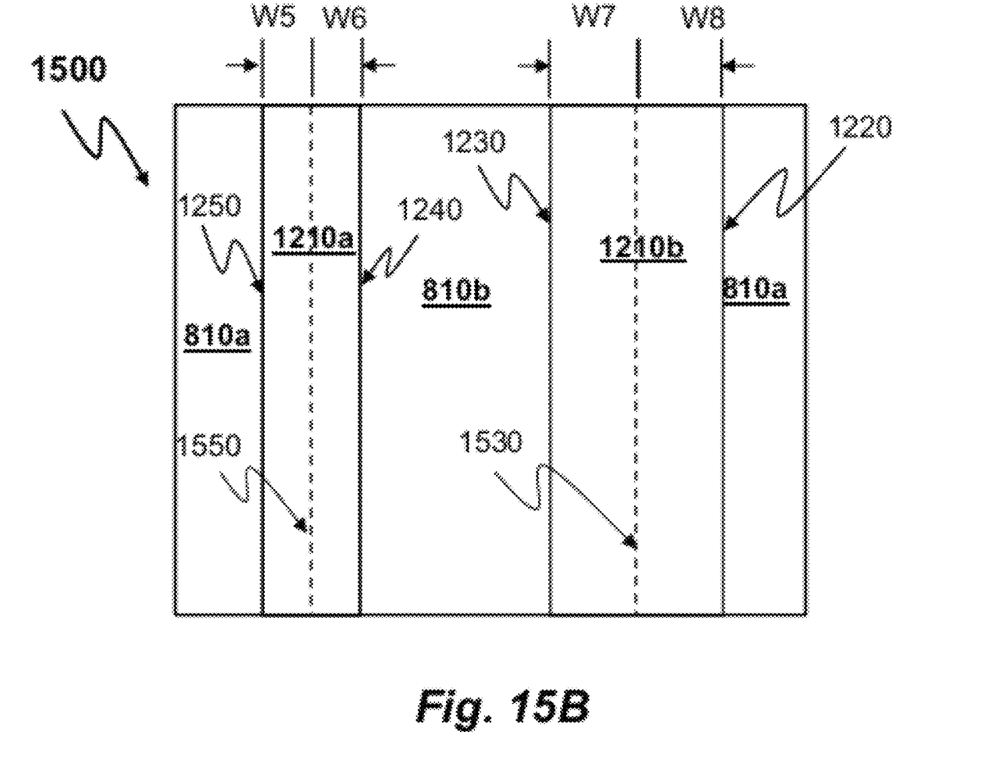
FIG. 15B shows a top view of the structure shown in FIG. 15A.

FIGS. 15A and 15B show a side and top view of structure 1500, respectively. Structure 1500 includes a substrate 510 having the material 1210*a* and *b* (e.g. oxide to create an STI) and at least a first region (e.g. a doped or ion implanted region 810*a*); the trench 1110*b* having the first edge or first boundary 1220 (e.g. the side wall or bottom of the trench 1110*b* or material 1210*b*); the first region 810*a* having a boundary 1530 (e.g. the edge or boundary of the doped region 810*a* where it connects to an adjacent substance such as oxide material of 1210*b*); the first region (e.g. the doped region 810*a*) being coupled to (e.g. touching) at least a first portion of the trench 1110*b* (e.g. the bottom and/or side of the trench 1110*b* or material 1210*b*) such that a portion of the boundary 1530 of the first region 810*a* is at a predetermined distance W8 from the first edge 1220 of trench 1110*b* (e.g. with respect to the side of the trench and doped regions as shown as W8 between elements 810*a* and 1210).

FIGS. 15A and 15B also show the structure 1500, having a second region 810*b* (e.g. another doped region); the second region 810*b* having the same boundary 1530 (e.g. edge) as doped region 810*a* and coupled to at least a second portion 1230 of the material 1210*b* (e.g. a sidewall and/or bottom of trench 1110*b*) such that a second portion of the boundary 1530 (e.g. a portion of the boundary around second region 801*b*) is at a second predetermined distance (W7) from a second edge boundary 1230 of trench 1110*b*. The predetermined distance, W7, and the second predetermined distance W8, are substantially similar and coupled (e.g. W7 is about equal to W8).

Likewise, FIGS. 15A and 15B show the second trench 1110*a* having a material 1210*a*, a boundary 1240 of trench 1110*a*, and a doped region 810*b* having a boundary 1550 and adjacent to material 1210*a*. The distance between boundaries 1240 and 1550 is shown as W6. Region 810*a* further has boundary 1550 adjacent and coupled to a boundary 1250 of material 1210*a*. The distance between boundary 1250 and boundary 1550 is shown as W5. Where W5 and W6 are substantially equal.

It should be apparent to one of ordinary skill in the art that the foregoing description and drawings are meant to provide an illustrative example of developing regions that are self-aligned with edges such as edges of shallow trenches and changes to the structure and process may be modified without departing from the spirit and scope of the invention.

What is claimed is:

1. A method comprising:
   depositing a thin oxide on a substrate;
   depositing a Polysilicon adjacent to the thin oxide;
   performing photolithography using a reticle;
   performing an etch;
   implanting the Polysilicon;
   annealing the substrate;
   depositing nitride;
   performing a CMP process;
   removing the Polysilicon;
   performing an RIE step on the exposed oxide and silicon;
   depositing the oxide;
   performing the CMP process; and
   removing the nitride.

2. The method of claim 1 further comprising one or more implanting steps.

3. A method comprising:
   layering a first substrate (510) and a first film (505) to form a layered substrate;
   forming a trench in the layered substrate, the trench having at least one edge;
   implanting a first region coupled to a first portion of the trench;
   annealing the first region;
   depositing a second film (610) on the layered substrate;
   performing a first planarizing process;
   removing at least a portion of the first film;
   performing a reactive ion etching process;
   depositing a structure (910);
   performing a second planarizing process; and
   removing a portion of the second film (610).

* * * * *